United States Patent [19]

Yatsuo et al.

[11] Patent Number: 4,682,199

[45] Date of Patent: Jul. 21, 1987

[54] HIGH VOLTAGE THYRISTOR WITH OPTIMIZED DOPING, THICKNESS, AND SHEET RESISTIVITY FOR CATHODE BASE LAYER

[75] Inventors: Tsutomu Yatsuo; Naohiro Momma; Masayoshi Naito; Masahiro Okamura, all of Hitachi, Japan

[73] Assignee: Hitachi, Ltd., Tokyo, Japan

[21] Appl. No.: 489,505

[22] Filed: Apr. 28, 1983

Related U.S. Application Data

[63] Continuation of Ser. No. 261,666, May 7, 1981, abandoned, which is a continuation of Ser. No. 949,119, Oct. 10, 1978, abandoned.

[30] Foreign Application Priority Data

Oct. 14, 1977 [JP] Japan .................................. 52-123235

[51] Int. Cl.⁴ .............................................. H01L 29/74
[52] U.S. Cl. ............................................... 357/38; 357/20; 357/55; 357/86; 357/90
[58] Field of Search ....................... 357/20, 38, 86, 90, 357/55

[56] References Cited

U.S. PATENT DOCUMENTS

| | | | |
|---|---|---|---|
| 3,513,363 | 5/1970 | Herlet | 357/38 |
| 3,855,611 | 12/1974 | Neilson et al. | 357/38 |
| 3,897,286 | 7/1975 | De Cecco et al. | 357/38 |
| 3,990,091 | 11/1976 | Cresswell et al. | 357/38 |
| 4,060,825 | 11/1977 | Schlegel | 357/38 |
| 4,062,032 | 12/1977 | Neilson | 357/38 |

FOREIGN PATENT DOCUMENTS 50-147679 11/1975 Japan .

OTHER PUBLICATIONS

E. Schleger, "A Tech. for Opt. the Design of Power Semi. Devices," IEEE Trans. on Elec. Dev., vol. Ed.-23, #8, Aug. 1976, pp. 924-927.

J. Shimizu et al., "High-Volt. High-Pwr. Gate-Assisted Turn-Off Thyr. for H-F Use," IEEE Trans. on Elec. Dev., vol. Ed-23, #8, Aug. 1976, pp. 883-887.

Primary Examiner—Joseph E. Clawson, Jr.
Attorney, Agent, or Firm—Antonelli, Terry & Wands

[57] ABSTRACT

In a high-voltage thyristor comprising a semiconductor body having contiguous pnpn four layers, and opposed anode and cathode electrodes and a gate electrode provided for the semiconductor body, one of p-base and n-base regions having an impurity concentration higher than the other has an impurity concentration which is no more than $8 \times 10^{15}$ atoms/cm³ in the vicinity of a junction between the one base region and an adjacent emitter region and which has a gradually decreasing gradient toward the other contiguous base region. The one base region has a sheet resistance of 500 to 1500 ohms/□. The realization of a high-voltage, large-diameter and large-current thyristor can be ensured.

15 Claims, 12 Drawing Figures

HIGH VOLTAGE THYRISTOR WITH OPTIMIZED DOPING, THICKNESS, AND SHEET RESISTIVITY FOR CATHODE BASE LAYER

This is a continuation of application Ser. No. 261,666, now abandoned, filed May 7, 1981, which is a continuation of application Ser. No. 949,119, now abandoned.

BACKGROUND OF THE INVENTION

This invention relates to thyristors and more particularly to an improved structure of high-voltage and large-current thyristors suitable for power controlling.

A thyristor of the type comprising a semiconductor body having between two major surfaces four contiguously laminated layers of alternate different conduction types of pnpn to form at least three p-n junctions between the adjacent two layers, a pair of main electrodes making ohmic contact to the surfaces of two outer layers, and a gate electrode in contact with one intermediate layer serves as a semiconductor switching element which switches the conduction state between the main electrodes from off-state to on-state when a relatively small electrical signal is applied to the gate electrode. In a thyristor of this type, the most important parts for determining the electrical characteristics of the thyristor, such as voltage blocking capability, conduction capability and switching speed, are two intermediate layers, (called base layers) and especially important design parameters are the dimensions, thickness in particular, resistivity and the impurity concentration profile of the base layers. Of the two base layers, one base layer having a higher resistivity has the resistivity and dimension (thickness) which are substantially definitely determined by the intended value of withstand voltage, almost losing the degree of freedom of design contributive to the improvement in the capabilities. From viewpoint of improving the capabilities of a thyristor, discussion must be concentrated on the other base layer having a lower resistivity. The other base layer is usually formed by solid diffusion technique of impurity (dopant) from the surface of semiconductor body.

To follow the preparation process generally employed, description will be given of a thyristor having the starting material of an n-type conduction semiconductor wafer and the other base layer of p-type formed therein by the solid diffusion technique. One base layer of higher resistivity and the other base layer are herein called an n-base layer $n_B$ and a p-base layer $p_B$, respectively. One outer layer adjoining the p-base layer and the other outer layer adjoining the n-base layer are called an n-emitter layer $n_E$ and a p-emitter layer $p_E$, respectively.

The resistivity and the impurity concentration profile of the p-base layer directly affect the characteristics required of the thyristor such as withstand capability to critical rate of rise of off-state voltage dv/dt, gate firing sensitivity and the like. Required of a high-voltage thyristor for use in a thyristor valve of an ac-dc converter for dc power transmission are high dv/dt withstand capability of more than 1500 v/µs and a non-firing gate current of more than 10 mA. An excessive gate sensitivity by which the gate is enabled by a small current is unfavorable and the gate sensitivity must be moderate especially at the maximum operating temperature for the purpose of preventing the erroneous firing of thyristor which would otherwise be caused by a very small current induced in the gate circuit. The realization of those high dv/dt capabilities and moderate, rather low gate firing sensitivity can be ensured by decreasing the resistivity of the p-base layer. In the conventional thyristor design, the sheet resistivity and impurity concentration of the p-base layer were mainly determined from these viewpoints.

Figure 1:
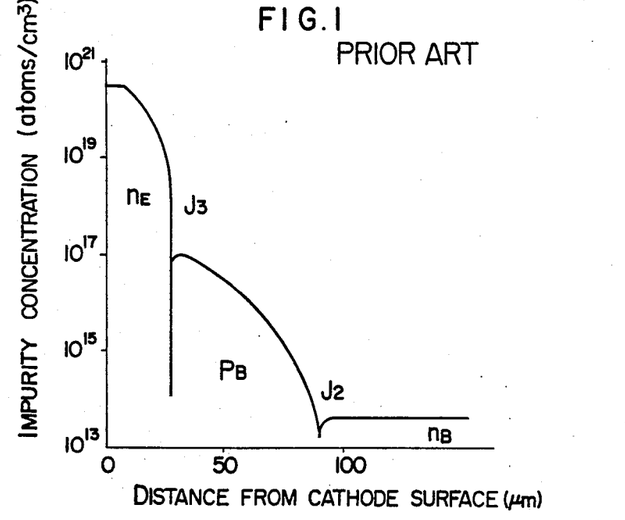
FIGS. 1 and 2 are graphical representations of impurity concentration profiles in the pnpn layer of conventional thyristors.

FIG. 1 shows impurity concentration profiles of n-emitter and p-base layers of a thyristor conventionally used.

As will be seen from an exemplary illustration in FIG. 1, the p-base layer interposed between an n-emitter layer/p-base layer junction $J_3$ and a p-base layer/n-base layer junction $J_2$ is usually designed to have a sheet resistance of about 100 to 200 $\Omega/\square$ and an impurity concentration of about $10^6$ to $10^{17}$ atoms/cm$^3$ in the vicinity of the junction $J_3$. This has been well known as disclosed, for example, in (1) "3000 Volt and 1300 Ampere Two inch Diameter Thyristor" by C. K. Chu et al in Proceedings of the 5th Conference on Solid State Devices, Tokyo, 1973, Suppl. J.J.A.P., vol. 43, 1974 and (2) "Application of New Technologies to H.V.D.C. Thyristor Production" by K. H. Sommer et al in World Electrotechnical Congress Record, section 5A, paper 47.

The conventional thyristor with the aforementioned profile has the following disadvantages.

Figure 2:
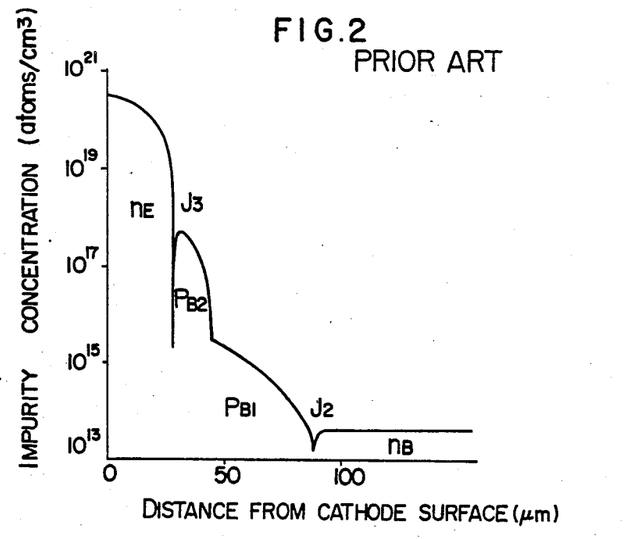

One defect results from the high impurity concentration in the vicinity of the junction $J_3$. The p-base layer having the high impurity concentration in the vicinity of the junction $J_3$ leads to shortening of the lifetime of carriers in the p-base layer and reduction in the emitter injection efficiency. As a result, on-characteristic for high conduction is impaired. The high impurity concentration gradient in the vicinity of the junction $J_2$ responsible for increase in the surface electric field at a portion of the junction exposed to the thyristor edge introduces the other defect that makes it difficult to achieve the high withstand voltage capability. To eliminate the latter defect, some of the conventional thyristors have been manufactured having a two-step impurity concentration profile as exemplified in FIG. 2. More particularly, this type of thyristor comprises a p-base layer consisting of two different impurity concentration regions having over the wafer a first step region $P_{B1}$ of low concentration formed adjacent to the junction $J_2$ and a second step region $P_{B2}$ of relatively high concentration formed adjacent to the junction $J_3$, as disclosed, for example in the aforementioned literature by Sommer et al.

The two-step p-base layer with a gentle concentration gradient in the first step region which is effective to reduce the surface electric field at the edge of junction $J_2$ has succeeded in making a high-voltage thyristor. This type of thyristor having the two-step concentration profile, however, is still unsuccessful in eliminating the defect due to the high impurity concentration in the vicinity of junction $J_3$ as mentioned above. In addition, this measure involves the inherent problem raised when creating a large-current thyristor of an average rating current of 250 to 3000 A by extending the diameter of junction surface to about 100 mm. More particularly, in order to achieve the large current capability with a large diameter wafer, it is necessary to uniform the operation within the single crystalline wafer. To this end, a p-base structure accessible to the lateral uniformity is required. In the thyristor having the concentration profile shown in FIG. 2, however, since the gradient of base layer impurity concentration in the vicinity of the junction $J_3$ between n-emitter and p-base regions (in $P_{B2}$ region) is large, even slight irregularity in dimension, especially in thickness, of the p-base layer due to the manufacturing processes causes the sheet resistance of p-base layer to vary to a great extent. Due to this variation, an irregular spreading of the on-region and a current convergence during turn-off operation occur. Accordingly, this base structure presents difficulties in the manufacture of large-current thyristors having good operational uniformity.

An approach to reduce the high impurity concentration of p-base region at the working point junction is proposed in U.S. Pat. No. 3,990,091 issued Nov. 2, 1976. But this patent aims to decrease the gate sensitivity of the thyristor, and does not satisfactorily solve the problem of operational non-uniformity due to the geometrical irregularity in the thyristor wafer even with the proposed impurity concentration profiles.

SUMMARY OF THE INVENTION

Accordingly, an object of this invention is to provide a thyristor with high-voltage and large-current conversion capacity suitable for high power transmission by proposing an improved structure of p-base layer involving a specified impurity concentration and profile thereof in order to eliminate the conventional drawbacks.

Another object of this invention is to provide a high-voltage and large-current thyristor with a low-concentration and extensive-thickness p-base layer by improving the structure in the vicinity of the gate electrode.

A principal feature of this invention resides in taking advantage of the positive nature of a thyristor provided with a p-base layer in the form of a deep diffusion layer having a low impurity concentration, in order to solve the problem that the operational irregularity due to geometrical irregularity within the wafer presents, which problem is a hindrance to the realization of a large-current thyristor with a large diameter wafer, by making the p-base layer take the form of the deep diffusion layer having a low impurity concentration of no more than $8 \times 10^{15}$ atoms/cm$^3$ in the neighbourhood of an n-emitter layer and by designing the p-base layer to have a sheet resistance of 500 to 1500 $\Omega/\square$ (ohms per square).

Another feature of the invention resides in causing, in a high-voltage and large-current thyristor provided with a p-base layer in the form of a deep diffusion layer having a low impurity concentration, the base layer to have in part a lower sheet resistance in the vicinity of a gate electrode than in the other part to thereby prevent the degradation in switching characteristics of the gate portion such as dv/dt, switching power withstand capability and gate firing sensitivity. The neighbourhood of the gate electrode herein covers a region ranging from a location at which the base layer is in contact with the gate electrode, to an emitter shunt bore associated with an emitter layer closest to the periphery of the gate electrode.

The above and other objects, features and advantages of the present invention will become apparent from the following detailed description of the invention taken in conjunction with the accompanying drawings.

BRIEF DESCRIPTION OF THE DRAWINGS

In the drawings, like members or like parts are designated by like reference numerals and symbols.

DESCRIPTION OF THE PREFERRED EMBODIMENTS

Figure 3:
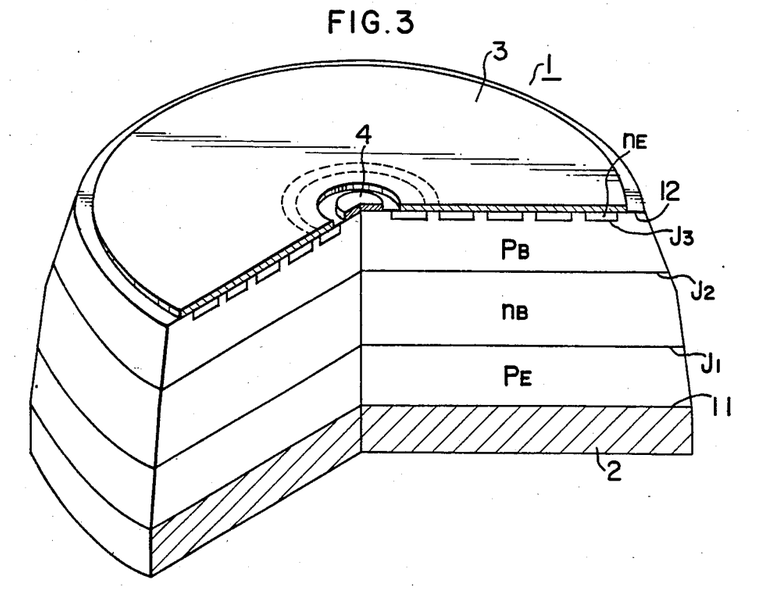
FIG. 3 is a schematic sectional view of one embodiment of a thyristor according to the present invention.

Referring to FIG. 3, there is shown a thyristor structure embodying the present invention which is of a center-gate type only for the purpose of exemplary illustration.

Figure 4:
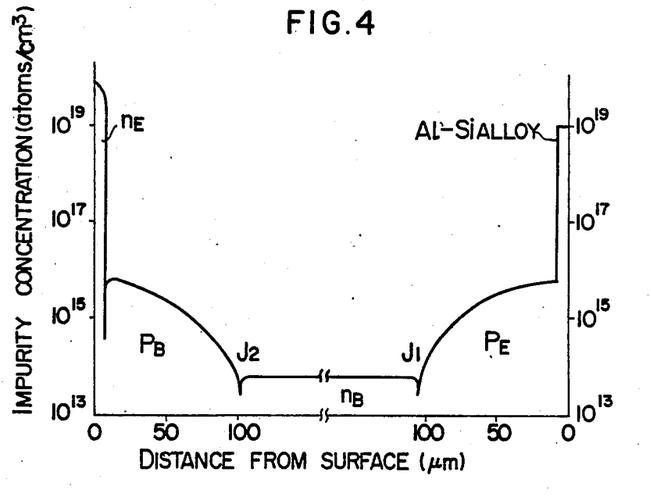
FIG. 4 is a graphical representation of impurity concentration profile in the pnpn layer of the thyristor shown in FIG. 3.

A semiconductor body 1 shown in FIG. 3 comprises two major surfaces 11 and 12, alternate different conduction type layers of a p-emitter region $p_E$, an n-base region $n_B$, a p-base region $p_B$ and an n-emitter region laminated between the major surfaces to form p-n junctions $J_1$, $J_2$ and $J_3$ between adjacent layers. An anode electrode 2 formed of a tungsten support having an aluminum grazing material, a cathode electrode 3 formed of an aluminum film, and a gate electrode 4 make ohmic contact of low resistance to one major surface 11, the $n_E$ layer on the side of the other major surface 12, and the $p_B$ layer at the center on the side of the other major surface 12, respectively. The $P_B$ layer partly passes through the $n_E$ layer to extend up to the other major surface 12 and to be exposed thereat so that the surface of the $p_B$ layer partly makes low-resistive, ohmic contact connections to the cathode electrode 3 which short or shunt the junction $J_3$ to the cathode electrode 3. The illustrated thyristor has an impurity concentration profile in the lamination direction as shown in FIG. 4 with respect to the regions in the semiconductor body. The p-base layer $p_B$ has an impurity concentration of 3 to $5 \times 10^{15}$ atoms/cm$^3$ in the vicinity of the junction $J_3$, a thickness of 90 to 110 $\mu$m, and a sheet resistance of 600 to 1000 $\Omega/\square$, underneath the junction $J_3$.

This thyristor is prepared through the following processes. An n-type silicon single crystalline wafer of 200 to 300 $\Omega$cm resistivity, 85 to 110 mm diameter and about 1 mm thickness is used as a starting material. Aluminum is diffused from both the surfaces of the starting material to form the p-base layer $p_B$ and p-emitter layer $p_E$. More particularly, the material wafer along with an aluminum diffusion source is placed in a vacuum sealed quartz tube and subjected to a diffusion treatment at about 1000° C. for a few hours to form in the silicon surface an aluminum thin diffusion layer having a thickness of several microns and a high concentration in the order of $10^{20}$ atoms/cm$^3$. Thereafter, the wafer is removed from the quartz tube and heated in oxygen atmosphere at 1250° C. for 50 to 70 hours to drive-in the aluminum diffusion layer to a depth of about 150 μm. The latter process is a so-called slumping. In this manner, aluminum is doped through a two-step diffusion method. Next, a surface portion of the aluminum diffusion layer is etched-off by a depth of about 40 μm to be described later with reference to FIG. 5. This etching process is effective to prevent the poor reproductivity of profile due to the fact that aluminum present close to the surface is out-diffused exteriorly thereof during the drive-in diffusion to decrease the concentration in the vicinity of the surface after completion of the diffusion. The removal of surface portion is preferably performed by chemical etching because the thickness of the layer can be adjusted uniformly along geometrical irregularities of the wafer by chemical etching, unlike lapping, so that uniformity of diffusion depth after removal can easily be obtained. In this manner, the thickness of the diffused wafer is adjusted by etching-off its surface until the diffused layer assumes a sheet resistance of 500 to 600 Ω/□. Around this depth, the gradient of impurity concentration is minimized. Under this condition, as seen from aluminum impurity concentration profile in FIG. 5, an effective diffusion depth of aluminum ranges from 90 to 110 μm from the wafer surface exposed by etching-off, forming the $p_B$ layer. For measurement of sheet resistance on the diffused layer surface, a well-known sheet resistance measuring method such as the three-probe method may be employed.

Figure 5:
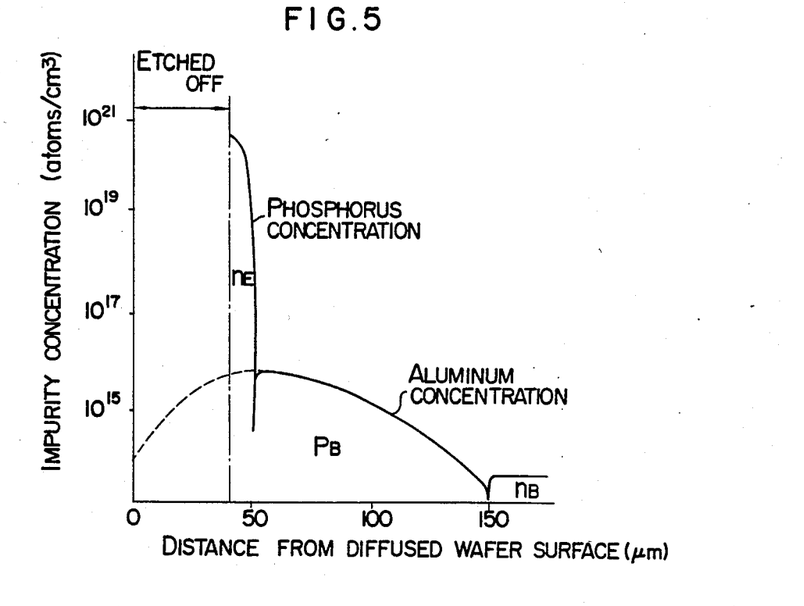
FIG. 5 is a graphical representation useful to further explain the impurity concentration profile in the semiconductor wafer of the thyristor according to the present invention.

As will be seen from the detailed impurity concentration profile of the aluminum diffusion wafer shown in FIG. 5, in the neighbourhood of the surface removed of the low concentration layer, the aluminum impurity concentration distribution has a maximum value of 3 to $5 \times 10^{15}$ atoms/cm$^3$. In other words, in the neighbourhood of the silicon wafer surface after chemical etching, the aluminum concentration distribution is maximized. The sheet resistance around the surface is measured to be determined to 600 to 1000 Ω/□. Next, that surface exposed by etching-off treatment is masked with an oxide film such as SiO$_2$ film and phosphorus is diffused into the wafer through windows in a desired pattern formed in the oxide film mask. The phosphorus diffusion continues for a few hours at 1100° C. to form the $n_E$ layer having a depth of about 10 to 20 μm and an impurity concentration in the order of $10^{21}$ atoms/cm$^3$. For formation of the $n_E$ region, in place of the phosphorus diffusion through the SiO$_2$ film mask, another process may be employed wherein a phosphorus diffusion layer of about 10 μm thickness is formed over the wafer surface and is then locally or selectively removed by chemical etching through a selective mask applied on the layer. The diffused wafer thus prepared is shaped into a desired configuration, and mounted with the anode, cathode and gate electrode by metalizing aluminum to make ohmic contact to the semiconductor layer. The anode electrode is then mounted with the tungsten material by well-known bonding to complete a thyristor.

This thyristor provided with the p-base layer $p_B$ having a low concentration of $8 \times 10^{15}$ atoms/cm$^3$ at the most and a large thickness of approximately 100 μm is advantageous in the following points:

(a) The low impurity concentration of p-based layer ensures high injection efficiency of n-emitter junction $J_3$ and elongates the lifetime of the p-base layer ensuring that the on-voltage can be reduced.

(b) The gentle gradient of concentration in the vicinity of the junction $J_2$ of p-base layer facilitates the reduction in the surface electric field at the junction edge, thereby providing the high withstand voltage. In other words, the effect of a bevel structure can be manifested.

(c) The sheet resistance of p-base layer can easily be uniformed within the wafer, making it possible to realize the large-current thyristor.

(d) In the p-base region, the sheet resistance is designed to be high. Accordingly, the short-circuiting or shunting of n-emitter junction can be established at a high density to improve the turn-off characteristic.

It was proven experimentally that $8 \times 10^{15}$ to $1 \times 10^{15}$ atoms/cm$^3$ p-type impurity concentration in the vicinity of the junction $J_3$ and 500 to 1500 Ω/□ sheet resistance of the p-base layer underneath junction $J_3$ were necessary to attain the above advantages. If the impurity concentration in the vicinity of junction $J_3$ exceeds $8 \times 10^{15}$ atoms/cm$^3$, the satisfactorily long lifetime of electrons in the p-base layer, on the one hand, disappears even when the high conduction continues and the low injection efficiency, on the other hand, increases the on-voltage. If the impurity concentration is less than $1 \times 10^{15}$ atoms/cm$^3$, the intended sheet resistance cannot be obtained by the diffusion of practically satisfactory time, for example, for 100 hours. If the sheet resistance of p-base layer exceeds 1500 Ω/□, the gate firing sensitivity of thyristor becomes excessive and the erroneous firing due to the critical rate of rise of off-state voltage dv/dt tends to occur. Only the shunt of junction $J_3$ compensates for the gate firing sensitivity and the dv/dt withstand capability to no effect. If the sheet resistance is less than 500 Ω/□, the p-base layer need be of an extremely wide area. The thickness of the intermediate layer having a relatively short lifetime is also enlarged and accordingly, the on-characteristic of thyristor is greatly impaired. In addition, for preparation of the thyristor of this structure, an extremely deep diffusion of the p-type impurity is required and when the two-step diffusion method involving slumping is employed, the out-diffusion causes the concentration in the vicinity of the wafer surface to greatly decrease and the portion of the decreased concentration, that is, the portion being removed by etching-off is deepened to give rise to trend to impairing uniformity of the impurity concentration and lateral sheet resistance of the p-base layer. Namely, the sheet resistance tends to become irregular. Most preferably, the impurity concentration and sheet resistance of the p-base layer respectively were to range 3 to $5 \times 10^{15}$ atoms/cm$^3$ and 600 to 1000 Ω/□, as described with reference to the embodiment. For these ranges, the p-base layer $p_B$ has a thickness ranging from 90 to 110 μm.

The thyristor provided with the low concentration and large thickness base layer according to the present invention is further advantageous in the following points. In the thyristor of the invention, the gradient of impurity concentration in the vicinity of the central junction $J_2$ is necessarily minimized. This decreases the injection efficiency of hole carries from the p-base layer to the n-base layer through the central junction. Thus, in the reverse blocking state in which the junction $J_1$ is reversely biased, diffused hole components from the low concentration p-base layer reaching the vacant layer in junction $J_2$ were experienced to decrease, thereby greatly decreasing the leakage current of high temperatures. Further, in ordinary thyristors, the p-emitter layer $p_E$ and the p-base layer $p_B$ are formed simultaneously by p-type impurity diffusion adapted to the formation of p-base layer so that the p-emitter layer $p_E$ has substantially the same thickness as the p-base layer $p_B$ and the impurity concentration gradient in the vicinity of junction $J_1$ substantially equals the impurity concentration gradient in the vicinity of junction $J_2$. Accordingly, the aforementioned reduction in the leakage current at high temperatures attributable to the low concentration gradient in the vicinity of the junction may be expected in both the forward and reverse blockings of the thyristor.

With the thyristor having this structure, the inventors have advanced their study, making an attempt to maintain balance between the dv/dt withstand capability, the switching power withstand capability and the gate firing sensitivity at the gate portion and to obtain simultaneous satisfaction of all the required capabilities of the switching characteristics.

The low concentration p-base layer is generally responsible for its very high sheet resistance and hence, has difficulties with, as described hereinbefore, the realization of moderate gate sensitivity necessary for obtaining high dv/dt withstand capability and preventing the erroneous firing. While the dv/dt withstand capability can be made as high as possible at the junction $J_3$ by establishing the spreading or distributed junction shunts at a high density, the conventional technique of emitter shunting alone cannot be a solution to the problem in question raised in connection with the gate portion. More particularly, at the gate portion, in general, the gate electrode for guiding the gate signal makes ohmic contact to the surface of p-base layer and the edge of n-emitter layer opposes the gate electrode. Accordingly, the p-base layer has a part of a certain width exposed around the gate electrode and it is necessary to by-pass a displacement current generated in the central junction close to the exposed part, which displacement current would otherwise build-up the junction $J_3$. The high sheet resistance of the p-base layer makes it difficult to establish the by-pass, resulting in a defect that the dv/dt withstand capability at the gate portion is greatly degraded as compared to the other portion.

Figure 6:
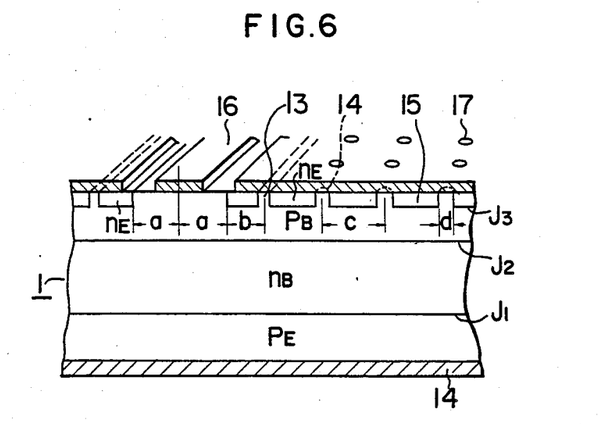
FIG. 6 is a partial sectional view of the thyristor useful to explain shunting of the base region.

This problem will be described in more detail with reference to FIG. 6. A thyristor shown therein comprises a gate electrode 16 making ohmic contact to the central part of the exposed part of p-base layer $p_B$ having a width of 2a, a short-circuit or shunt strap channel 13 formed in the junction $J_3$ along the gate electrode 16 and with a spacing of b from the edge of the exposed part, and shunt bores 14, 17 each having a diameter of d and arranged, outside the the strap shunt channel 13, in a regular matrix pattern with a lattice spacing of c. With this thyristor, in order to establish in the gate portion a by-pass which has the same ability as the shunts formed in the regular matrix pattern in the n-emitter layer, the 2a width of the p-base layer exposed part around gate electrode and the width b of the emitter junction opposite to the gate electrode must satisfy the following relation:

$$b^2 + 2ab - 2K_o \leq 0$$

where $$K_o = \frac{c^2}{4}\left(\ln\frac{c}{d} + \frac{d^2}{4c^2} - A\right)$$

Figure 7:
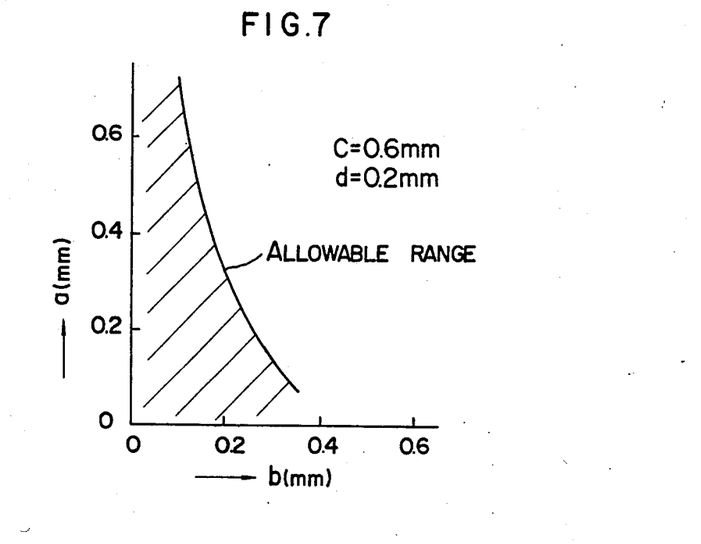
FIG. 7 is a graphical representation showing the relation between exposed width a of the p-base layer and width b of the emitter necessary for maintaining the same dv/dt at the gate portion as in the inner emitter region.

FIG. 7 graphically illustrates this relation for $c=0.5$ mm and $d=0.2$ mm.

The hatched area satisfies the required relation. As will be seen from this example, with a increasing beyond a certain value, allowable b becomes small rapidly. In general, the gate electrode is required to have a width which is large enough to mount a gate lead thereon, which is preferably about 1 mm. If the width a provided for the gate electrode is widened, the width b of the n-emitter layer to meet the dv/dt withstand capability is lessened correspondingly, falling below 0.15 mm.

With the narrow n-emitter layer width b, the resistance to switching power at the initial phase of turning-on by the gate signal is greatly degraded and the thyristor tends to break down. Also, the uniformity of turning-on along the gate electrode is disturbed, accelerating the tendency to switching breakdown.

Accordingly, measures for preventing the degradation of switching characteristics at the gate portion will be described in connection with embodiments of the invention by referring to FIGS. 8 to 12.

Figure 8:
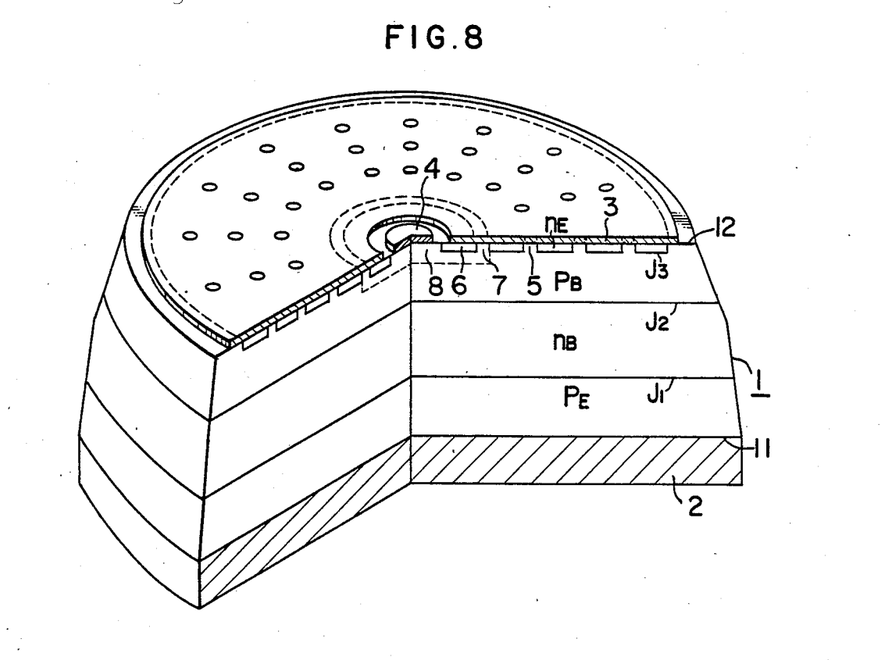
FIG. 8 is a perspective view, partly in longitudinal section, of another embodiment of a thyristor according to the present invention.

A semiconductor body 1 shown in FIG. 8 comprises major surfaces 11 and 12, and alternate different conduction type layers of $p_E$, $n_B$, $p_B$ and $n_E$ layers laminated between the major surfaces to form p-n junctions $J_1$, $J_2$ and $J_3$ between adjacent layers.

An anode electrode 2 in the form of a tungsten support, a cathode electrode 3 made of aluminum metal film, and a gate electrode 4 made of aluminum metal film make ohmic contact to the major surface 11 on the side of $p_E$ layer, the other major surface 12 on the side of $n_E$ layer, and the central part of the other major surface 12, respectively. The $p_B$ layer partly passes through openings 5 formed in the $n_E$ layer to extend up to the other major surface 12 and expose thereat so that the surface of the $p_B$ layer partly makes low-resistive, ohmic contact connections to the cathode electrode 3 which short the junction $J_3$ to the cathode electrode. Along the outer periphery of the $n_E$ layer opposite to the gate electrode is formed a shunt channel 7.

A p-type diffusion layer 8 of a relatively high concentration is provided, extending through the $n_E$ layer 6 surrounding the gate electrode 4 to the shunt channel 7 close to the gate electrode 4. Shunt openings 5 distributed in the $n_E$ layer have each a diameter of 0.2 mm and are spaced from each other by 0.5 mm. The exposed part of $p_B$ layer around the gate electrode has a diameter of about 5 mm and the $n_E$ layer 6 formed along the exposed part has a width of 1.0 mm.

This thyristor is prepared through the following processes. A n-type silicon single crystalline wafer of 200 to 300 $\Omega$cm resistivity, about 1 mm thickness and 85 to 110 mm diameter is used as a starting material. The silicon wafer along with an aluminum diffusion source is placed in a quartz tube filled with argon gases and heated at 1250° C. for 50 to 70 hours to form, on each surface of the wafer, a p-type diffusion layer having a surface concentration of about $1 \times 10^{16}$ and a depth of 100 to 120 $\mu$m. The surface of one diffusion layer is etched off uniformly by chemical etching to a depth of 10 to 20 $\mu$m and the thickness of the p-base layer is so adjusted that the p-base layer has a sheet resistance of about 600 Ω/□. Thereafter, boron is selectively diffused into the $p_B$ layer through a central window in an $SiO_2$ film mask for masking the gate region and surrounding region 8 to provide the region 8 with a surface concentration of $5 \times 10^{17}$ atoms/cm$^3$, a depth of 30 to 40 μm and a sheet resistance of 100 to 200 Ω/□ at the boron diffused wafer surface. Next, through a selective diffusion process using the same $SiO_2$ film mask, phosphorus is diffused. A diffusion from a $POcl_3$ diffusion source follows at 1100° C. for a few hours to form the n-emitter region 6 having a depth of about 10 to 20 μm. The diffused wafer thus prepared is shaped into a desired configuration and mounted with the anode, cathode and gate electrodes to complete a thyristor.

Figure 9:
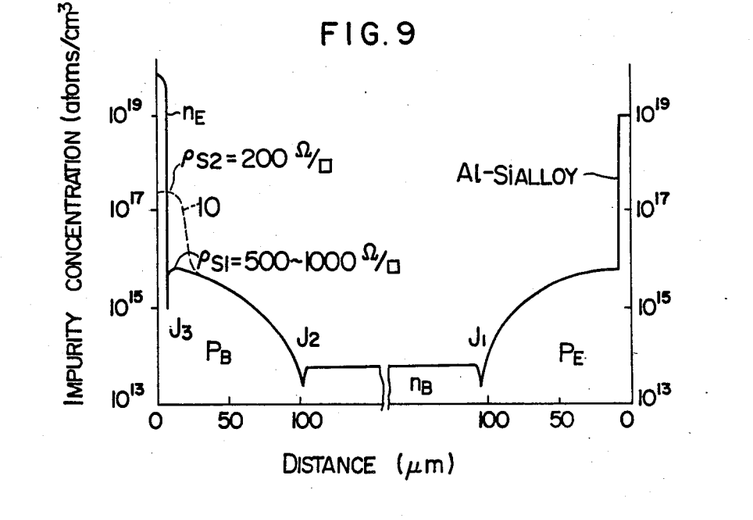
FIG. 9 is a graphical representation of an impurity concentration profile of the thyristor shown in FIG. 8.

FIG. 9 shows an impurity concentration profile in the longitudinal direction. The p-base layer $p_B$ has an impurity concentration of 3 to $5 \times 10^{15}$ atoms/cm$^3$ in the vicinity of the junction $J_3$, a thickness of 90 to 110 μm, and a sheet resistance of 500 to 1000 Ω/□ underneath the junction. The region 8 locally having a low sheet resistance as illustrated by a dotted line 10 has a surface concentration of less than $5 \times 10^{17}$ atoms/cm$^3$ and a sheet resistance of 100 to 200 μ/□.

This embodiment features (a) a p-base layer having a very high sheet resistance of 500 to 1000 Ω/□ underneath the $n_E$ layer, and (b) a reduced sheet resistance of 100 to 200 Ω/□ in the vicinity of the gate electrode. Further, a dv/dt withstand capability of 1500 V/μs or more and a non-firing gate current of no less than 15 mA can be obtained with this embodiment.

Since the p-base layer is designed to have a low sheet resistance underneath the $n_E$ layer 6 surrounding the gate electrode and within the extension to the shunt 7 close to the gate electrode, it is possible to satisfactorily elongate the width of $p_B$ layer exposed part provided for the gate electrode and the width of $n_E$ layer 6 without decreasing the dv/dt withstand capability. In addition, the main part of p-base layer has a satisfactorily low impurity concentration of 5 to $8 \times 10^{15}$ atoms/cm$^3$ underneath the $n_E$ layer. Furthermore, the impurity concentration profile of the p-base layer having the low concentration as well as deep depth of 100 μm has a gentle gradient in the vicinity of the junction $J_3$. Within the region where the p-base layer has the sheet resistance in the order of 500 to 1000 Ω/▽, the condition for the gentle gradient is easy to design. As described above, this embodiment meets the aforementioned requirement of low concentration and large-thickness p-base layer and fully maintains the advantage of that p-base layer in realizing the high-voltage and large-current thyristor.

Figure 10:
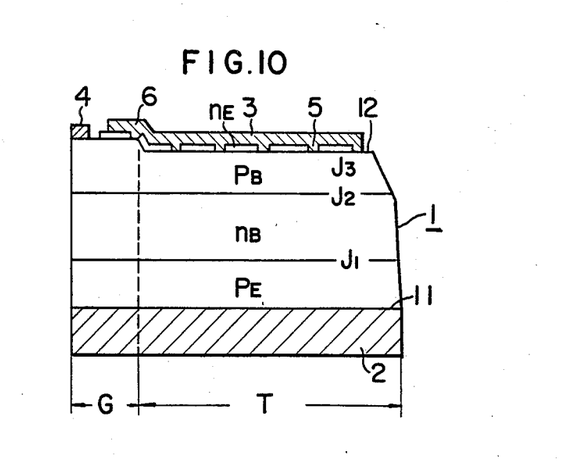
FIGS. 10 to 12 are partial sectional views of further embodiments of thyristors according to the present invention.

A further embodiment of the present invention will be described with reference to FIG. 10 in which like members and parts are designated by like reference numerals and symbols.

This embodiment is featured in that a $p_B$ layer is thicker in the vicinity of the gate electrode than in its main, extensive part and is different from the embodiment of FIG. 8 by comprising a shunt and $p_B$ layer exposed part lying below (deep) an $n_E$ layer surface. This thyristor is prepared through processes as described below. The same starting silicon material as in the previous embodiments is subjected to an aluminum deep diffusion to a depth of more than 100 μm and is then etched from one diffused layer surface by partial etching method such that a deeper etching is effected in one region T than in the other gate region G to provide the $p_B$ layer in region T with a sheet resistance of 500 to 600 Ω/▽. In region G, the one surface is less etched than in region T by a etching depth of about 20 μm to provide the $p_B$ layer in region G with a sheet resistance of 200 to 300 Ω/□.

Next, $POcl_3$ is diffused from both surfaces to form n-type layers thereon having a thickness of about 10 μm. The n-type layer on the side of anode is completely removed and the n-type layer on the side of cathode is partly removed. Thereafter, the cathode, anode and gate electrodes are formed to complete a sub-assembly. In this embodiment, the p-base layer also has the low sheet resistance in the vicinity of the gate electrode so that, as in the foregoing embodiments, the width of the p-base layer exposed part in gate region G and the width of $n_E$ layer surrounding the exposed part can be widened to a satisfactory extent for practical purposes without being accompanied by degradation in the dv/dt withstand capability and excessive gate sensitivity. This embodiment is advantageous over the embodiment of FIG. 8 in that the formation of the low sheet resistance region in the vicinity of the gate electrode dispenses with the additional, partial diffusion of p-type impurity.

Figure 11:
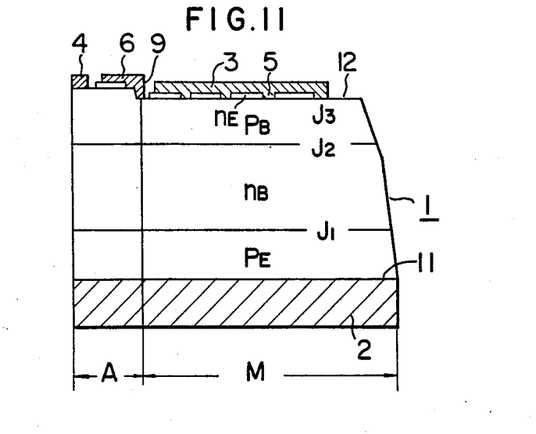

FIG. 11 shows a further embodiment of the invention which is applicable to a thyristor of a so-called amplifier gate structure. To this end, the p-base layer is designed to have a lower sheet resistance in an auxiliary thyristor region A than in the other region M. In this embodiment, since an auxiliary gate electrode 9 is not connected to a cathode electrode 3 directly, it is necessary to intentionally by-pass the displacement current converged to the electrode 9 by a suitable means.

Figure 12:
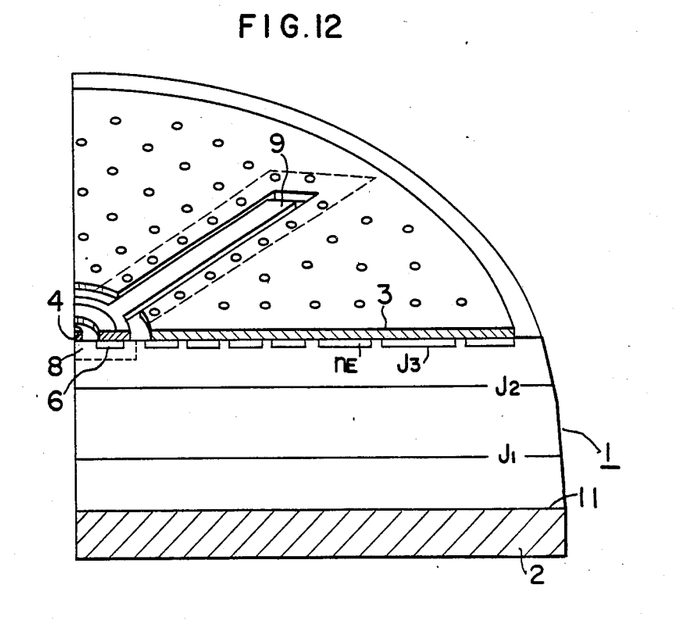

FIG. 12 shows another embodiment of an amplifier gate thyristor according to the present invention which takes into account the unsolved problem of the embodiment of FIG. 11. For adaptability to universal applications, the embodiment of FIG. 12 is illustrated as a modification of the embodiment shown in FIG. 8. This embodiment is featured in that a p-base layer comprises a low sheet resistance region 8 formed by boron diffusion which not only lies on the auxiliary thyristor portion but also radially extends to the main thyristor portion along an auxiliary gate electrode 9. Thus, this embodiment is advantageous in the following points: the width of auxiliary gate electrode can be widened (about 0.6 mm) satisfactorily for practical purposes without degrading the dv/dt withstand capability; and the displacement current generated in the entire region of the auxiliary thyristor portion can be by-passed, thereby increasing the dv/dt withstand capability throughout the gate portion.

As described, the present invention ensures that even with the p-base layer, through which the principal current flows, having a satisfactory high sheet resistance of 500 to 1000 Ω/□, the high dv/dt withstand capability can be maintained throughout the thyristor structure without causing reduction in the dv/dt withstand capability at the gate portion and excessive gate firing sensitivity, thus realizing the high-voltage and large-current thyristor provided with the low concentration p-base.

Although the foregoing embodiments have been described, for exemplary illustration purpose, by way of the center-gate type structure, it should be understood that the invention is by no means limited to this structure but may be applicable to a ring-gate structure and a corner-gate structure as disclosed in an article by some inventors et al entitled "Large Area Thyristor for HVDC Converter, IEEE, 1977, IEDM Technical Digest, pp 26–29.

What is claimed is:

1. A thyristor comprising a semiconductor body having a pair of major surfaces disposed opposite to each other and four pnpn layers of alternate different conductivity types laminated between the major surfaces to form p-n junctions between adjacent layers, said four layers including first and second intermediate layers and first and second outer layers, a pair of main electrodes respectively making ohmic contact to each outer layer on each major surface, and means for applying a triggering gate signal to switch the blocking stage of the thyristor to the conduction state between the main electrodes, and further comprising means for providing said thyristor with a dv/dt withstand capability substantially equal to or greater than 1500 V/$\mu$sec and a non-firing gate current substantially equal to or greater than 10 mA, said means comprising said first intermediate layer among said four layers having an impurity concentration higher than that of said second intermediate layer, with a maximum impurity concentration of 3 to $5 \times 10^{15}$ atoms/cm$^3$ at an interface in the vicinity of said first outer layer adjacent to said first intermediate layer, wherein the impurity concentration in said first intermediate layer gradually decreases toward the second intermediate layer, and in conjunction with said maximum impurity concentration, said first intermediate layer having a thickness of 90 to 110 $\mu$m and a sheet resistance of 600 to 1000 ohsm/□ between said first outer layer and said second intermediate layer underneath said interface.

2. A thyristor according to claim 1, wherein said first intermediate layer is of a p-conductivity type and said second intermediate layer is of an n-conductivity type.

3. A thyristor according to claim 1, wherein said first outer layer has a thickness of about 10 $\mu$m and is short-circuited by said first intermediate layer.

4. A thyristor according to claim 1, wherein said second outer layer has substantially the same impurity concentration and thickness as those of said first intermediate layer.

5. A thyristor according to claim 1, wherein said second outer layer has a thickness between 90 to 110 $\mu$m and a surface impurity concentration of substantially $1 \times 10^{16}$ atoms/cm$^3$.

6. A thyristor according to claim 3, wherein said second outer layer has a thickness between 90 to 110 $\mu$m and a surface impurity concentration of substantially $1 \times 10^{16}$ atoms/cm$^3$.

7. A thyristor according to claim 1, characterized in that the second outer layer has substantially the same thickness as the first intermediate layer and essentially the same impurity concentration as the first intermediate layer.

8. A thyristor according to claim 1, characterized in that the first intermediate layer has a lower sheet resistance in a part in the vicinity of a gate electrode for applying said triggering gate signal than in the remaining part of the first intermediate layer, whereby the part of the lower sheet resistance reaches from the vicinity of the gate electrode to the opposite first outer layer and adjoins this outer layer.

9. A thyristor according to claim 1, characterized in that the first intermediate layer has a higher impurity concentration in a part in the vicinity of a gate electrode for applying said triggering gate signal than in the remaining part of the first intermediate layer, whereby the part of higher impurity concentration extends to a shorted emitter portion of the thyristor closest to the gate electrode.

10. A thyristor according to claim 1, characterized in that a first intermediate layer has a greater thickness in the vicinity of a gate electrode for applying said triggering gate signal than in the remaining part of the first intermediate layer.

11. A thyristor according to claim 7, characterized in that the first intermediate layer has a lower sheet resistance in a part in the vicinity of a gate electrode for applying said triggering gate signal than in the remaining part of the first intermediate layer, whereby the part of lower sheet resistance reaches from the vicinity of the gate electrode to the opposite first outer layer and adjoins this outer layer.

12. A thyristor according to claim 7, characterized in that the first intermediate layer has a higher impurity concentration in a part in the vicinity of a gate electrode for applying said triggering gate signal than in the remaining part of the first intermediate layer, whereby the part of higher impurity concentration extends to a shorted emitter portion of the thyristor closest to the gate electrode.

13. A thyristor according to claim 8, characterized in that the first intermediate layer has a higher impurity concentration in a part in the vicinity of the gate electrode than in the remaining part of the first intermediate layer, whereby the part of higher impurity concentration extends to a shorted emitter portion of the thyristor closest to the gate electrode.

14. A thyristor according to claim 7, characterized in that a first intermediate layer has a greater thickness in the vicinity of a gate electrode for applying said triggering gate signal than in the remaining part of the first intermediate layer.

15. A thyristor according to claim 8, characterized in that a first intermediate layer has a greater thickness in the vicinity of the gate electrode than in the remaining part of the first intermediate layer.

* * * * *